United States Patent [19]

McAndrew

[11] Patent Number: 6,095,404
[45] Date of Patent: Aug. 1, 2000

[54] METHOD FOR ASSEMBLING HIGH TEMPERATURE ELECTRONICS

[75] Inventor: Charlie McAndrew, Cypress, Tex.

[73] Assignee: Innova Electronics, Inc., Houston, Tex.

[21] Appl. No.: 09/407,219

[22] Filed: Sep. 27, 1999

Related U.S. Application Data

[62] Division of application No. 09/084,074, May 22, 1998.
[51] Int. Cl.$^7$ ................................................. B23K 31/02
[52] U.S. Cl. .................. 228/180.1; 29/827; 228/180.21; 228/180.22; 228/203; 228/226; 228/262.9; 427/96; 428/643; 428/645; 428/901
[58] Field of Search .................................. 428/643, 645, 428/901; 29/827; 427/96; 228/208, 262.1, 262.31, 262.45, 262.51, 262.61, 262.8, 262.9, 180.1, 180.21, 180.22, 203, 226

[56] References Cited

U.S. PATENT DOCUMENTS 1,087,561   2/1914   Tebbetts, 2d ............................ 428/643

OTHER PUBLICATIONS

Manko, Solders and Soldering, 3$^{rd}$ Ed., McGraw Hill (1992), pp. 128–139.
Hwang, Modern Solder Technology for Competitive Electronics Manufacturing, McGraw Hill (1996), pp. 80–99.

*Primary Examiner*—Timothy Speer
*Assistant Examiner*—Robert R. Koehler
*Attorney, Agent, or Firm*—Alan J. Atkinson

[57] ABSTRACT

A method for soldering electronic components capable of withstanding high temperature applications. A solder having a composition in the range between 83 and 87% lead, between 8.5 and 11.5% antimony, and the balance of tin provides superior results. The solder uniquely provides a sufficiently low melting point to enable mass flow without destruction of plastic package parts, and a sufficiently high melting point to achieve 200 degrees C. operation. Good mechanical strength is achieved while providing sufficient creep to permit differential expansion between components and a printed wiring board. A heavy solder layer is coated on a printed wiring board and is oxidized to generate a thin solderable layer. Manufacture of the circuit board can be performed with conventional techniques such as wave soldering, hand soldering, solder printing, solder dispensing, and solder pre-forms.

9 Claims, 1 Drawing Sheet

Ternary Antimony-Tin-Lead phase diagram.

METHOD FOR ASSEMBLING HIGH TEMPERATURE ELECTRONICS

This application is a division of application Ser. No. 09/084,074 filed May 22, 1998, pending.

BACKGROUND OF THE INVENTION

The present invention relates to the field of electronics assembly. More particularly, the present invention relates to a composition and method for soldering electronics components capable of withstanding high temperature applications.

Electronic packages provide unique capabilities in equipment and tools positioned in commercial and industrial applications. Increasingly, such electronics packages are installed in environments hostile to the survivability of electronics. For example, the formation temperature downhole in hydrocarbon producing wellbores can exceed 150 degrees C., and such high temperatures can destroy electronic control or instrumentation packages within hours. Many solder alloys and printed wiring board ("PWB") plating systems have been used for high temperature electronics applications, however such systems are limited by certain factors. Additionally, electronic packages utilizing surface mount technology ("SMT") are increasingly using electronics in plastic packages, and the long-term reliability of such packages is reduced by high temperature applications.

Various PWB plating processes have been developed for assembling electronics packages. The most common process for standard "low temperature" applications uses a tin/lead composition over bare copper. A copper-clad printed wiring board is dipped in or plated with a 60/40 solder comprising approximately sixty percent tin and forty percent lead. The shelf life before soldering and surface solderability of this process is good, however the integrity of the solder joint and PWB integrity is destroyed at elevated operating temperatures over 100 degrees C. At elevated temperatures, tin in the solder and copper on the PWB form intermetallics detrimental to long-term reliability.

The formation of intermetallics in tin/lead solders can be inhibited by the addition of a low stress nickel barrier. A 200 micro-inch layer of nickel prevents intermetallic formation without compromising solderability or shelf life. However this process is ineffective for applications over 150 degrees C. because the tin/lead solder contaminates the higher temperature solders, lowering the melting point and degrading the high temperature characteristics.

Other efforts to eliminate tin and lead from the PWB have been accomplished by plating gold over a nickel barrier. A 50 micro-inch gold layer prevents passivation of the nickel to provide reasonable shelf-life characteristics, and the gold dissolves in the solder upon assembly. Wave solder assembly processes perform acceptably, however gold can accumulate in the solder pot. This accumulation requires frequent monitoring of pot impurities and replacement of the pot contents. When the assembly is performed by hand or by solder printing/dispensing and mass reflow, a portion of the gold remains in the solder and the remainder of the gold remains on the component pads. High temperature operation forms brittle gold intermetallics compromising the mechanical and electrical characteristics of the solder joint. Although the impact of such gold intermetallics can be moderated by reducing the gold content, the time for passivation of the nickel and related unsolderability of the board is also reduced.

Another technique for incorporating the positive benefits of gold is performed by depositing, approximately 10 micro-inches of electroless pure gold over 10 micro-inches of palladium over 200 micro-inches of low stress nickel. Acceptable shelf life is obtained because the palladium slows the nickel passivation and the gold slows the palladium passivation. This combination is preferable to a 50 micro-inch gold layer because the overall amounts of gold and palladium dissolved into the solder are reduced. However, this process is not conventionally used because the PWB manufacturing process for this combination is more complex and expensive than other processes.

Another technique uses pure tin over nickel and copper. This process was developed for use with high tin solders, and uses at least 200 micro-inches of pure tin deposited directly over a nickel barrier and fused to provide a low stress solderable surface. The shelf life and solderability of this combination is excellent, however this process is unsuitable for high lead solders because the mix results in a low temperature solder alloy. The affinity of tin for copper reduces the process reliability for certain applications, limiting the utility of this process.

Various solders are commonly used for high temperature electronics. References to conventional solders are found in Lea, *A Scientific Guide to Surface Mount Technology*, Electromechanical Publications Ltd. (UK) (1988), and in Manko, *Solders and Soldering*, $3^{rd}$ Edition, McGraw-Hill (1992). The most common solder alloy is known as Sn63, having 63% tin with a lead balance. This solder is a binary eutectic with a 183 degrees C. melting point. Although this solder is compatible with all of the plating systems described above, the mechanical strength of the alloy degrades significantly above 100 degrees C. Another common alloy known as HMP comprises 93.5% lead, 1.5% silver, and a tin balance. This alloy provides good results for operating temperatures over 200 degrees C., has a solidus temperature of 296 degrees C. and has a liquidus temperature of 301 degrees C. This solder is moderately compatible with tin and lead plating provided that the solder joint volume is large such as in wave solder applications. Another binary eutectic alloy is Sn96, having 96.5% tin and a silver balance. The melting point is 221 degrees C., it is mechanically stronger than HMP or Sn63, and retains its strength nearly until the melting point. The wettability is excellent, and the alloy permits mass reflow of plastic surface mount parts without damage. The disadvantages of this alloy are brittleness, particularly at low temperatures, and an affinity for copper. The brittleness results in low cycle solder joint fatigue with repeated temperature cycling when the thermal coefficients of expansion of the PWB substrate and the component are mismatched. For components with high copper content in the contacts, migration of tin into tile copper contact results in electrical and mechanical failure after short time periods when the exposure exceeds 150 degrees C.

As described above, tin and lead are incompatible for high temperature solder applications. High lead solders have high melting points and low mechanical strength. For automated plastic surface mount assembly, exposure of such components to high temperatures destroy the components. If the solder is the only mechanism for attaching electronic components to the PWB, the integrity of the PWB will be compromised at high temperatures. This limitation is particularly acute in applications having shock or vibration forces. High tin solders are too brittle when the thermal coefficients of expansion are mismatched, and tin-copper intermetallic growth causes premature joint failure at high temperatures. Although gold or palladium can improve the operating characteristics, such materials also create brittle intermetallics over time and generate problems in manufacture and assembly of the electronics packages.

SUMMARY OF THE INVENTION

The method of the invention describes assemblage of electronics to withstand high temperatures. The method comprises the steps of positioning a solder composition having lead in a range between 83–87 percent by weight, antimony in a range between 8.5–11.5 percent by weight, tin substantially comprising the balance of the composition, and assembling the electronics with said composition. In other embodiments of the method, a solder mask can be placed on a printed wiring board, a relatively thick layer of solder can be attached to the printed wiring board, the thick solder layer can be oxidized to prepare a thin solder layer, and electronics can be attached to the thin solder layer.

DESCRIPTION OF THE PREFERRED EMBODIMENTS

Figure 1:
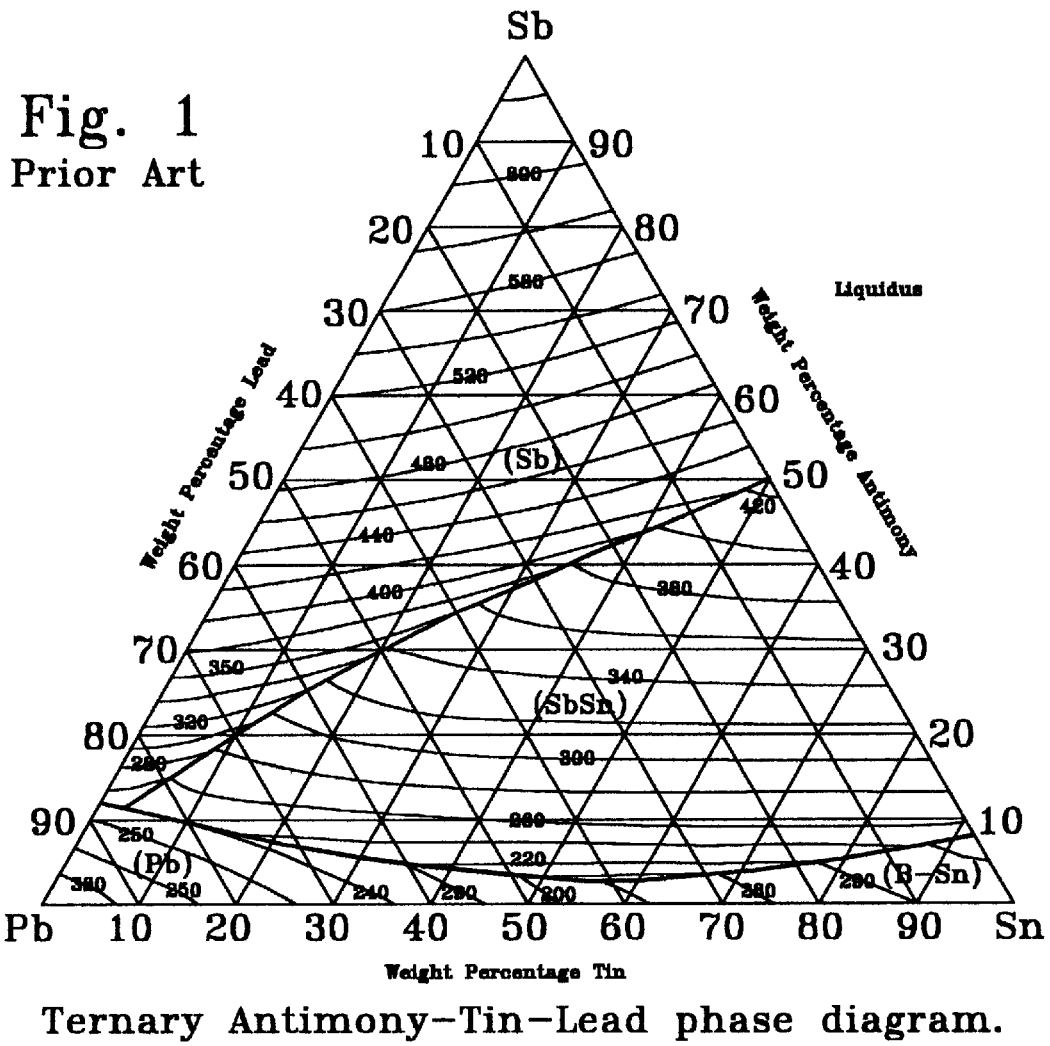
FIG. 1 illustrates a ternary antimony/tin/lead phase diagram.

The present invention provides a high temperature alloy for soldering electronic components. The invention discloses a lead/antimony/tin combination previously unused in the manufacture and assembly of electronics and electronics packages. The composition of the invention is defined as an alloy having between 83 and 87% lead, between 8.5 and 11.5% antimony, and the balance of tin. This composition has been discovered to be uniquely adaptable to the long term survivability of electronics connections in high temperature environments. This composition is identified by the trademark "Innovalloy" and servicemark "Innova Process", owned by Innova Electronics, Inc. of Houston, Tex. The performance of the composition at different temperatures is illustrated in the ternary antimony/tin/lead phase diagram illustrated in FIG. 1 and prepared by K. Iwase and N. Aoki, *Kinsoku-No-Kenkyu*, Vol. 8, p. 253 (1953).

This invention provides superior results as determined by tests for high temperature, vibration, and impact test criteria. High temperature endurance tests over 1000 hours at 175 degrees C., and temperature cycling tests between 25 degrees C. and 175 degrees C. were compared against conventional control samples, and the reliability of the test results demonstrated significant benefits.

The relatively high lead content of the invention provides desirable creep properties found in conventional Sn63 and HMP alloys. Lead comprises a soft, malleable and ductile metallic element having atomic number 82, atomic weight 207.19, and melting point of 327.5 degrees C. Tin comprises a malleable metallic element having atomic number 50, atomic weight 118.69, and melting point of 231.89 decrees C. The lower tin content provides for wettability in normal circumstances. Antimony comprises a metallic content provides for wettability in normal circumstances. Antimony comprises a metallic element having four allotropic forms. The most common form of antimony is hard, brittle, lustrous, crystalline material used in alloys with lead in battery plates and in the manufacture of flame-proofing compounds, paints and ceramic products. Antimony has atomic number 51, atomic weight 121.75, and melting point of 630.5 degrees C. The antimony in the composition strengthens the lead rich alloy, enhances the wetting, and depresses the melting point to permit reliable mass reflow of plastic devices. The solder resulting from this unique combination provides adequate mechanical strength up to 200 degrees C.

The solder defined by the composition has a nominal solidus temperature of 239.4 degrees C. and a limit temperature of 235 degrees C. The nominal liquidus temperature is 243.3 degrees C. and a limit temperature of 250 degrees C.

The method of the invention removes solder plating attached to a base such as a PWB. This is accomplished by heating the low temperature solder plating to 210 degrees C. and maintaining such temperature for approximately thirty minutes before cooling the solder plating to ambient temperature. During this process, the solder melts and most of the solder oxidizes and turns to ash. This procedure leaves a very thin solderable layer on the PWB.

Different solderable surfaces can be incorporated with the invention and all of the PWB plating systems described in the Background of the Invention, and others, can be used in various applications of the technology. In a preferred embodiment of the invention, the solderable PWB surface can comprise tin/lead over nickel over copper. For nonsolderable areas a solder mask is placed over nickel plating.

For PWB plating, a solder mask is applied to the bare PWB after copper and nickel plating to leave exposed only the areas to be soldered. Approximately 500 micro-inches of tin/lead solder is then applied by electroplating and fusing, or dipping and hot air leveling. Such thick coating of the solder provides good shelf life and solderability as known in the prior art. Surface flatness of component pads and lands is not a concern because the bulk of the solder is removed before soldering. No solder is applied to other areas of the PWB such as surface interconnecting traces. This procedure avoids reflow of the low temperature alloy in such areas at high temperatures.

After the solder is oxidized to prepare the thin solderability layer, subsequent manufacture can proceed with conventional techniques. Although hand soldering and solder printing are the most common, wave soldering, solder dispensing, and solder preforms are possible. The composition range stated herein for tin, lead and antimony can be changed to add trace elements or componds to vary the properties of the solder without departing from the scope of the invention.

The solder uniquely provides a sufficiently low melting point to enable mass flow without destruction of plastic package parts, and a sufficiently high melting point to achieve reliable operation at 200 degrees C. for extended time periods. Good mechanical strength is achieved while providing sufficient creep to permit differential expansion between components and a printed wiring board. The minimal plastic range is less than 15 degrees C., and the solder is compatible with most existing PWB plating systems. The toxicity levels are not higher than conventional solders, and the manufacture is relatively easy and inexpensive to perform. The solder works well with component leads having high copper content, nickel/iron content such as alloy 42, and other component leads having trace amounts of cobalt and coeffficients of expansion similar to ceramics. This flexibility suits the solder defined by the invention for general purpose application in addition to high temperature applications.

Although the invention has been described in terms of certain preferred embodiments, it will become apparent to those of ordinary skill in the art that modifications and improvements can be made to the inventive concepts herein without departing from the scope of the invention. The embodiments shown herein are merely illustrative of the inventive concepts and should not be interpreted as limiting the scope of the invention.

What is claimed is:

1. A method for assembling electronics to withstand high temperatures, comprising the steps of:

positioning a solder composition having lead in a range between 83–87 percent by weight, antimony in a range between 8.5–11.5 percent by weight, and tin substantially comprising the balance of the composition; and assembling the electronics with said composition.

2. A method as recited in claim 1, further comprising the steps of positioning a printed wiring board and of soldering the electronics to said printed wiring board.

3. A method as recited in claim 2, further comprising the step of attaching said solder composition to said printed wiring board before the electronics are soldered to said printed wiring board.

4. A method as recited in claim 3, further comprising the step of applying a low temperature solder to said printed wiring board before said solder composition is attached to said printed wiring board.

5. A method as recited in claim 4, wherein said low temperature solder is approximately 500 micro-inches thick.

6. A method as recited in claim 3, further comprising the step of heating said solder composition attached to said printed wiring board to oxidize said solder composition before the electronics are soldered to said printed wiring board.

7. A method as recited in claim 1, wherein said solder composition substantially comprises lead for 85 percent of the composition, antimony for 10 percent of the composition, and tin for 5 percent of the composition.

8. A method as recited in claim 1, further comprising the step of contacting said solder composition to component leads having a high copper content.

9. A method as recited in claim 1, further comprising the step of contacting said solder composition to component leads substantially formed with a nickel/iron composition.

* * * * *